United States Patent
Newson et al.

(10) Patent No.: US 6,704,704 B1
(45) Date of Patent: Mar. 9, 2004

(54) SYSTEM AND METHOD FOR TRACKING AND AUTOMATICALLY ADJUSTING GAIN

(75) Inventors: Paul E. Newson, Bellevue, WA (US); Roderick M. Toll, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 262 days.

(21) Appl. No.: 09/800,393

(22) Filed: Mar. 6, 2001

(51) Int. Cl.[7] .............................................. G10L 19/14
(52) U.S. Cl. ...................................................... 704/225
(58) Field of Search .................................. 704/270, 275, 704/225; 375/344, 345; 455/126

(56) References Cited

U.S. PATENT DOCUMENTS 5,722,056 A * 2/1998 Horowitz et al. ............ 455/126
6,324,228 B1 * 11/2001 Millward et al. ............ 375/244

OTHER PUBLICATIONS

Gupta, V. et al., "Talking with Computers", *Telesis*, 9(1), 4–7.

Hersent, O.G. et al., "IP Telephony: Packet–Based Multimedia Communications Systems", Published by Addison Wesley, Oct. 1999, ISBN: 020169105, Copy of Entire Book 1–456.

Ishibashi, Y. et al., "Adaptive QoS Control for Video and Voice Traffic in Networked Virtual Environments", *IEEE, Proceedings Ninth International Conference on Computer Communications and Networks*, Oct. 16–18, 2000, 638–642.

Kyungho, C. et al., "Intelligent Adaptive Gain Adjustment and Error Compensation for Improved Tracking Performance", *IEICE Transactions of Information and Systems*, Nov. 2000–Japan, E83–D(11), 1952–1959.

Slutski, L. et al., "Analysis and Enhancement of Human–Machine Interfaces Using a Joystick Controller", *Human Factors and Ergonomics in Manufacturing*, Spring 2000, 10(2), 161–175.

* cited by examiner

Primary Examiner—Susan McFadden
(74) Attorney, Agent, or Firm—Woodcock Washburn LLP

(57) ABSTRACT

A method and system for monitoring the audio data from an audio input device while it is in use and adjusting the gain on that device based on tracked historical error rate data to approach a target error rate.

18 Claims, 6 Drawing Sheets

SYSTEM AND METHOD FOR TRACKING AND AUTOMATICALLY ADJUSTING GAIN

FIELD OF THE INVENTION

The present invention relates generally to the field of computing. more particularly, the invention relates to a system and method for dynamically controlling audio gain.

BACKGROUND OF THE INVENTION

In audio applications, the gain applied to a signal from an audio input device (e.g. a microphone) must be adjusted to compensate for differences in the hardware devices used, the voice of the speaker, the distance between the speaker and the audio input device, and so on. If the gain is set too high the signal may be amplified beyond the range of a digital converter and result in a clipped signal. As a result, any audio output reproduced from the signal may be distorted and incomprehensible. On the other hand, if the gain is set too low, any audio output reproduced from the signal may be too low to be clearly heard or may be undetectable.

Commonly, when an audio input application is run for the first time, input gain is set to a maximum and the audio signal is sampled from the input device. The gain is then adjusted until no clipping is detected on the input device. The input gain is thus set once the first time the application is run and each time thereafter that the application is run, the input device gain is set to this level. If conditions change, the level set when the application was run for the first time may no longer be appropriate for the new conditions. Examples of conditions which may result in such an effect are as follows: a different speaker uses the audio input device, the speaker is not at the same distance from the audio input device, the speaker speaks louder or softer or in some other way changes his speaking style, or an audio device is changed or reconfigured.

SUMMARY OF THE INVENTION

In view of the foregoing, there is a need for a system that overcomes the drawbacks of the prior art. The present invention addresses these shortcomings by monitoring the audio data coming from the audio input device while it is in use and adjusting the gain (volume) dynamically to obtain a clear strong input signal.

According to an aspect of the invention, the frequency of clipping of the audio input signal is tracked at different gain levels and an input level approaching a target clipping rate is ascertained. The target clipping rate may Ad vary from application to application but in general a target clipping rate is very low but not zero. If it is found that there is too much clipping, gain may be lowered, preferably by a small increment. Preferably gain will be lowered if the tracking history indicates that the clipping rate at the lowered gain is closer to the target clipping rate than the clipping rate at the present (unlowered) rate.

If it is determined that clipping occurs too infrequently, the gain level is increased. Thereafter, if it is determined that the gain level has caused clipping that exceeds the target clipping frequency, the gain level will be lowered again.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF THE INVENTION

Overview

In audio applications, the gain applied to a signal from an audio input device (e.g. a microphone) must be adjusted to compensate for differences in the hardware devices used, the voice of the speaker, the distance between the speaker and the audio input device, and so on. If the gain is set too high, a clipped signal may result, distorting reproduction of the signal. If the gain is set too low, any audio output reproduced from the signal may be too low to be clearly heard or may be undetectable.

Typically, when an audio input application is run for the first time, input gain is set to a maximum and gain is then adjusted until no clipping is detected on the input device. The input gain is thus set once the first time the application is run and each time thereafter that the application is run, the input device gain is set to this level. If conditions change, the level set when the application was run for the first time may no longer be appropriate for the new conditions. The present invention is directed to dynamic adjustment of the gain level in response to changing audio pick-up conditions.

Illustrative Computer Network Environment

Figure 1:
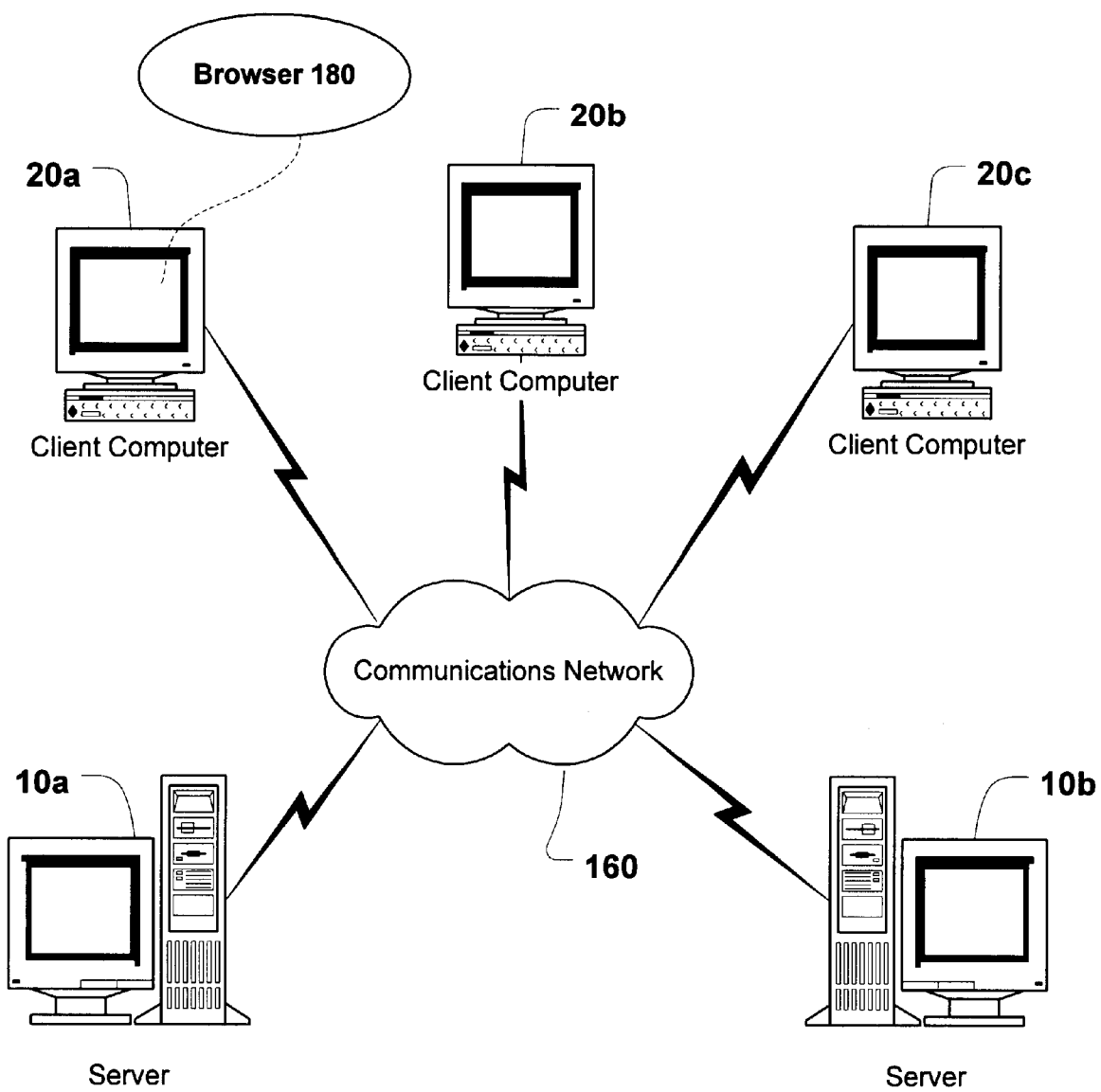
FIG. 1 is a block diagram representing an exemplary network environment with a server in accordance with the present invention.

The present invention may be deployed as part of a computer network. In general, the computer network may comprise both server computers and client computers deployed in a network environment. FIG. 1 illustrates an exemplary network environment, with a server in communication with client computers via a network, in which the present invention may be employed. As shown in FIG. 1, a number of servers 10a, 10b, etc., are interconnected via a communications network 160 (which may be a LAN, WAN, intranet or the Internet) with a number of client computers 20a, 20b, 20c, etc. In a network environment in which the communications network 160 is the Internet, for example, the servers 10 can be Web servers with which the clients 20 communicate via any of a number of known protocols such as hypertext transfer protocol (HTTP). Each client computer 20 can be equipped with a browser 180 to gain access to the servers 10. In addition to using the network 160 in a client-server configuration, client computer 20a, 20b, 20c may communicate directly with each other in a peer-to-peer configuration.

The present invention is preferably deployed in a network environment, particularly where that network is an Internet or Intranet environment. The term "Internet" is an abbreviation for "Internetwork," and refers commonly to the collection of networks and gateways that utilize the TCP/IP suite of protocols, which are well-known in the art of computer networking. TCP/IP is an acronym for "Transport Control Protocol/Internet Protocol." The Internet can be described as a system of geographically distributed remote computer networks interconnected by computers executing networking protocols that allow users to interact and share information over the networks. Because of such wide-spread information sharing, remote networks such as the Internet have thus far generally evolved into an "open" system for which developers can design software applications for performing specialized operations or services, essentially without restriction.

Electronic information transmitted by one of the common protocols (e.g., TCP/IP, UDP, etc.) is generally broken into packets. The packets are addressed to one of the other computers 20a, 20b, 20c, 10a, 10b connected to network 160. The addressed computer receives the packets, strips out the information content of the packets, and reassembles the transmitted electronic information. The electronic information may be audio, video, text and so on.

A transmission of audio data, as in a gaming application, can be sent by a client application program to a server or to another client, depending on the game configuration. If the data is transmitted to a server, the server may transmit this data to another client application program. The client process may be active in a first computer system, and the server process may be active in a second computer system, communicating with one another over a communications medium, thus providing distributed functionality and allowing multiple clients to take advantage of the capabilities of the server.

Thus, the present invention can be utilized in a computer network environment having client computers for accessing and interacting with the network and a server computer for interacting with client computers. However, the systems and methods for reproducing audio data stream transmission in accordance with the present invention can be implemented with a variety of network-based architectures, and thus should not be limited to the example shown. The present invention can also be utilized in stand-alone computer systems unconnected to a network, in embedded systems, in speech to text implementations and in any other sort of computer system where audio gain control is helpful. The present invention will now be described in more detail with reference to a presently illustrative implementation.

Reproduction of Audio Data

Figure 2:
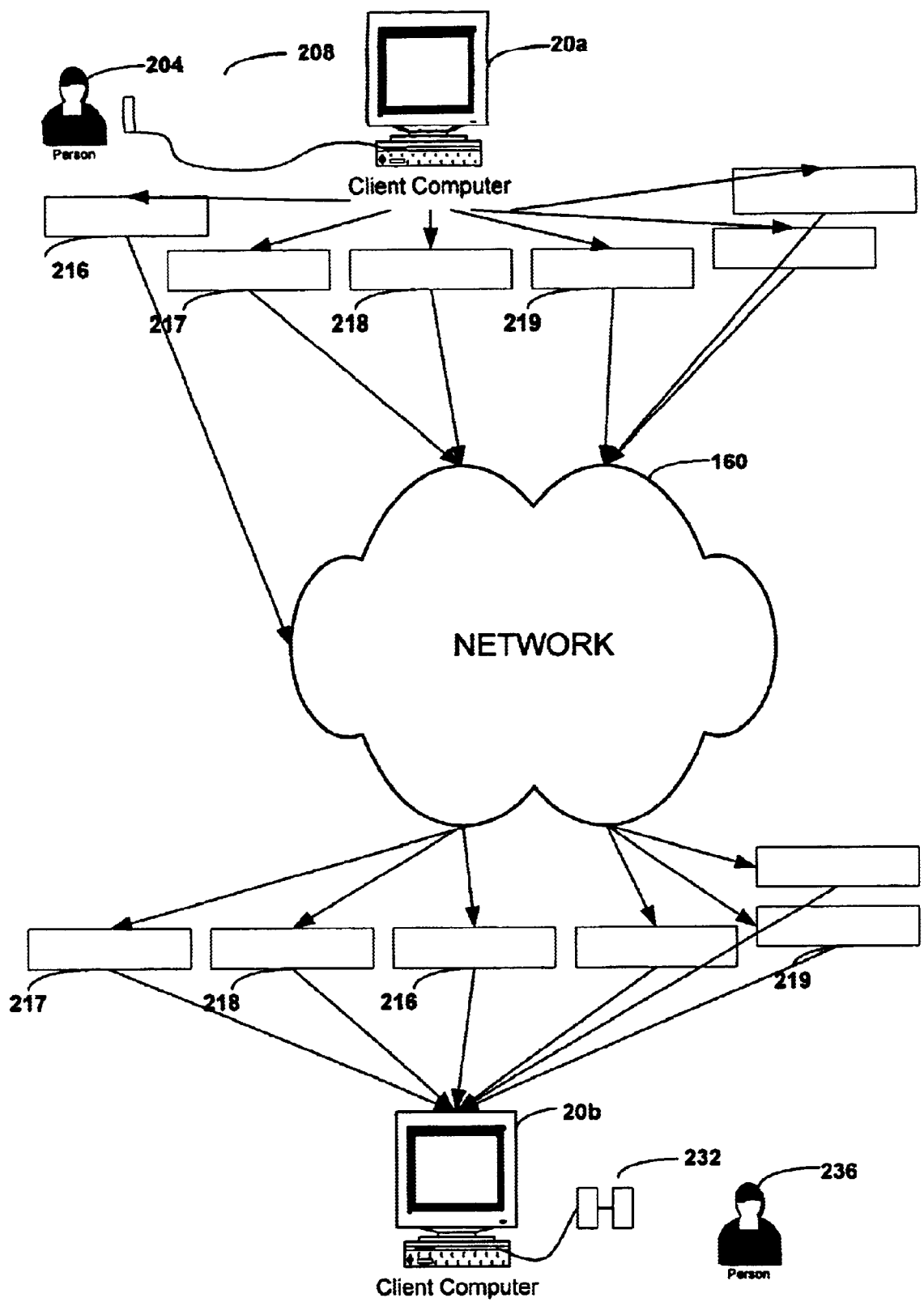
FIG. 2 is a block diagram representing the flow of audio data in an exemplary network environment.

FIG. 2 is a block diagram of an exemplary network environment in which a user 204 inputs audio data through an audio input device 208, such as but not limited to, a microphone, connected to a transmitting device 20a for transmission to a receiving device 20b through a network 160. The transmitted audio data received by receiving device 20b may be output to an audio output device 232, such as but not limited to, speakers, to user 236. It should be understood that although in the exemplary diagram sound is initiated by a user 204, the source of the sound may be any source, including but not limited to persons, mechanisms or any other source of audio input.

Typically in a packet-switched network 160, data including audio data is transferred through the network 160 in packets, e.g. 216, 217, 218, 219, etc., and reassembled at its destination for reproduction. Because packets can be routed through a number of different pathways, packets sent in order may not be received in order. Packets are reassembled into their proper sequential order at the destination.

Production of Sound in a Medium

An object produces sound when it vibrates in a medium. Typically the medium in which an object vibrates is air, although sound can also travel through liquids and solids. When, for example, a bell is rung, the metal of the bell vibrates, pushing air particles on that side out when the metal flexes out, such that a wave of pressure flows through the atmosphere. When the metal of the bell flexes in, air particles are drawn in towards the metal, creating a drop in pressure.

Different sounds are heard because of variations in frequency and amplitude. Frequency refers to the number of fluctuations in pressure in a period of time, interpreted by humans as a higher pitch. Pitch is lower when there are fewer fluctuations in a period of time. Amplitude is a measure of the air pressure level, interpreted by humans as the loudness of a sound.

Figure 3:
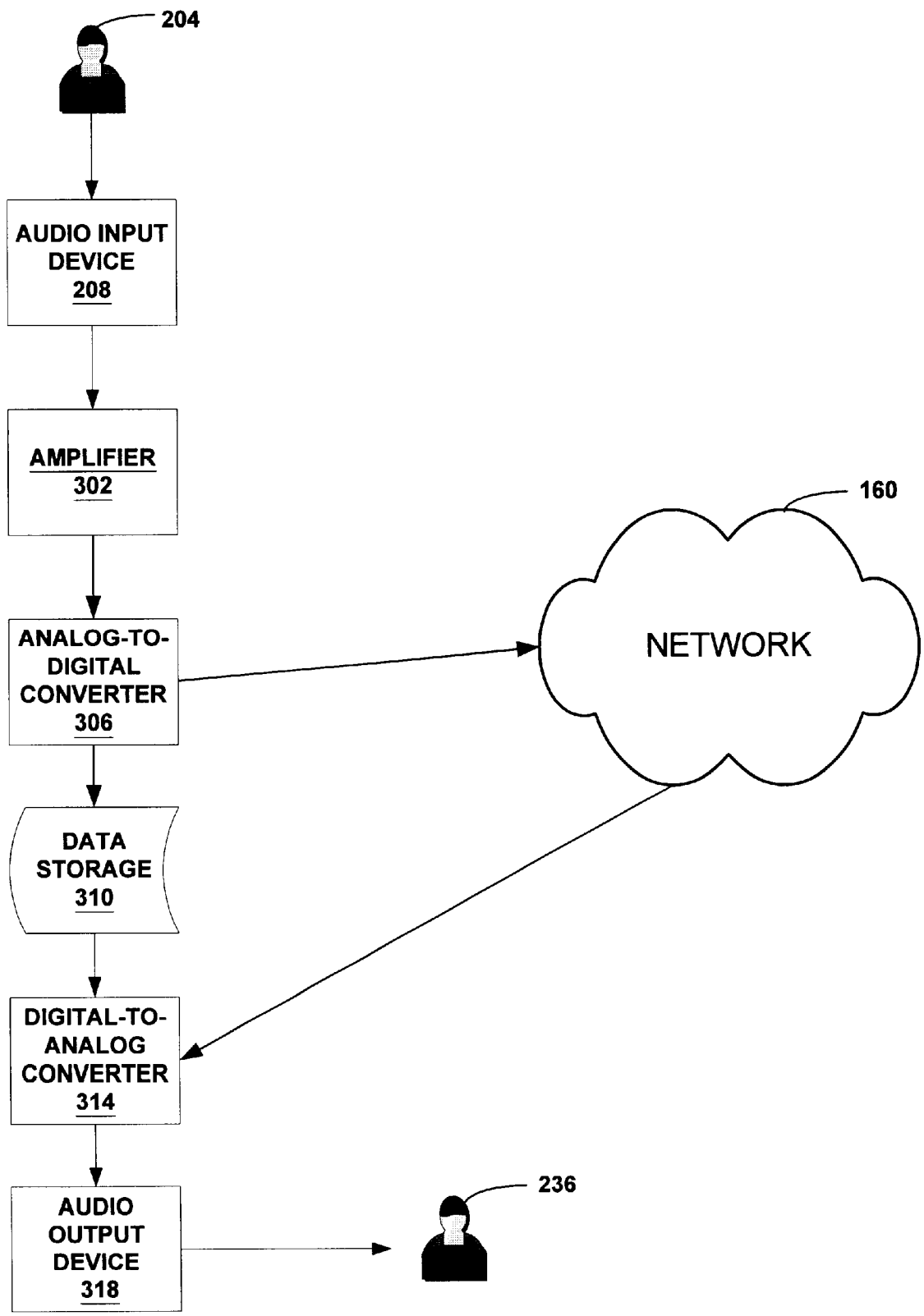
FIG. 3 is a block diagram representing reproduction of audio data.

FIG. 3 illustrates the reproduction of audio data. When a sound wave, such as but not limited to, speech from a user 204, reaches an audio input device 208 such as a microphone, typically a diaphragm on the microphone or other audio input device, vibrates in response to the sound wave, an analog signal. An analog-to-digital converter 306 converts the analog wave into a stream of numbers and may record the numbers on a storage medium 310 rather than recording the analog wave. Alternately, the stream of numbers may be transmitted through a network 160, as described above, or processed by the computing device itself. The stream of numbers may be converted back to an analog wave by a digital-to-analog converter 314. The analog wave produced by digital-to-analog converter 314 may be amplified and sent to audio output device 318 to reproduce the sound received by audio input device 208.

Sampling rate refers to how many samples of the analog wave are taken per second to be converted into a stream of numbers. Sampling precision refers to how many different quantization levels are possible when taking the sample. Sampling rate and precision determine sampling error, which refers to the degree to which the reproduced audio varies from the original. The greater the sampling rate and sampling precision, the smaller the sampling error and the more closely the reproduced audio resembles the original sound wave.

Clipping refers to the chopping off of the tops and bottoms of analog sound waves, resulting in distorted, poor quality sound reproduction. Clipping can result in cases when the gain (volume) is set too high.

Structure of a Data Structure for Monitoring Dynamic Adjustment of Gain

Figure 4:
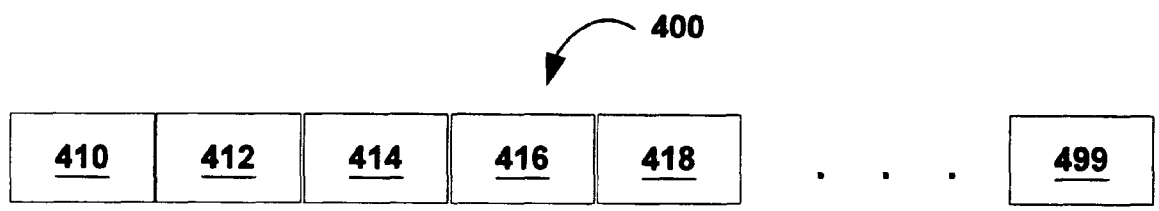
FIG. 4 is a block diagram representing a data structure for storing clipping rate at various gain levels in accordance with the invention.

FIG. 4 illustrates a data structure 400 in accordance with the present invention. Data structure 400 in a preferred embodiment includes cells, 410, 412, 414, 416, etc. Each cell 410, 412, 414, 416, etc. represents a gain level, for example, cell zero 410 may represent a gain level of 1, cell one 412 may represent a gain level of 2 and so on. Each cell 410, 412, 414, 416, etc. may contain the rate of clipping experienced at that particular gain level. For example, cell zero 410 may contain a clipping rate of 0.1 associated with a gain level of 1. It should be understood that the particular number of cells in data structure 400 as depicted in FIG. 4 is in all ways an arbitrary one and selected for exemplary purposes only. The scope and spirit of the invention encompasses a data structure of any appropriate size and number of cells. The number of cells in data structure 400 represents the number of gain levels recognized by the invention. The invention does not view input gain as a continuous value, but as a discrete one with a finite number of possible values. The number of cells in data structure 400 determines the number of discrete gain values recognized by the invention. By raising the number of cells in data structure 400, gain values of arbitrary precision can be achieved.

In a preferred embodiment data structure 400 may be an array but it should be understood that the present invention contemplates the use of any suitable data structure.

In accordance with the present invention, the gain level represented by cell number of array 400 is automatically adjusted in response to changing audio pickup conditions that an audio communications application encounters. Such changes may result from differences in the hardware devices used, changes in the voice of the speaker, changes in the distance between the speaker and the audio input device, and so on. The present invention determines the gain level that most closely results in a target error rate for the application, given current pickup conditions and dynamically adjusts gain to that value. The present invention can be used in any application that uses audio input including but not limited to gaming applications, speech to text applications and in embedded systems such as cellular phones and set top boxes.

Clipping errors are tracked and the rate of clipping errors at each gain level is stored in array 400. Gain level thus is modified as a function of how many clipping errors in audio reproduction occur.

The present invention determines the gain that most closely results in the target clipping error rate for the application, given the current audio pickup conditions. The present invention automatically adjusts the gain to achieve the clipping error rate approaching the target clipping error rate. In general, target clipping rate is one in which there is a very low but not zero incidence of clipping in the input data.

The present invention monitors and tracks the clipping error rate experienced at different gain levels and dynamically selects the gain level that provides a clipping error rate approaching the target clipping error rate selected for the application. If it is found that the current gain level is not producing enough clipping, the input gain may be raised. If too much clipping is taking place, (that is, the rate of clipping exceeds the target clipping rate), the gain may be lowered. The gain will only be lowered if the gain level it is changing to is associated with a rate of clipping that is closer to the target rate of clipping than the clipping rate associated with the current gain level. The gain level is raised unconditionally if the rate of clipping becomes too low. No user intervention is required for the application using the present invention in order to adapt to these different circumstances. If conditions change while the application is running, the present invention will change the gain level to adapt.

Figure 5:
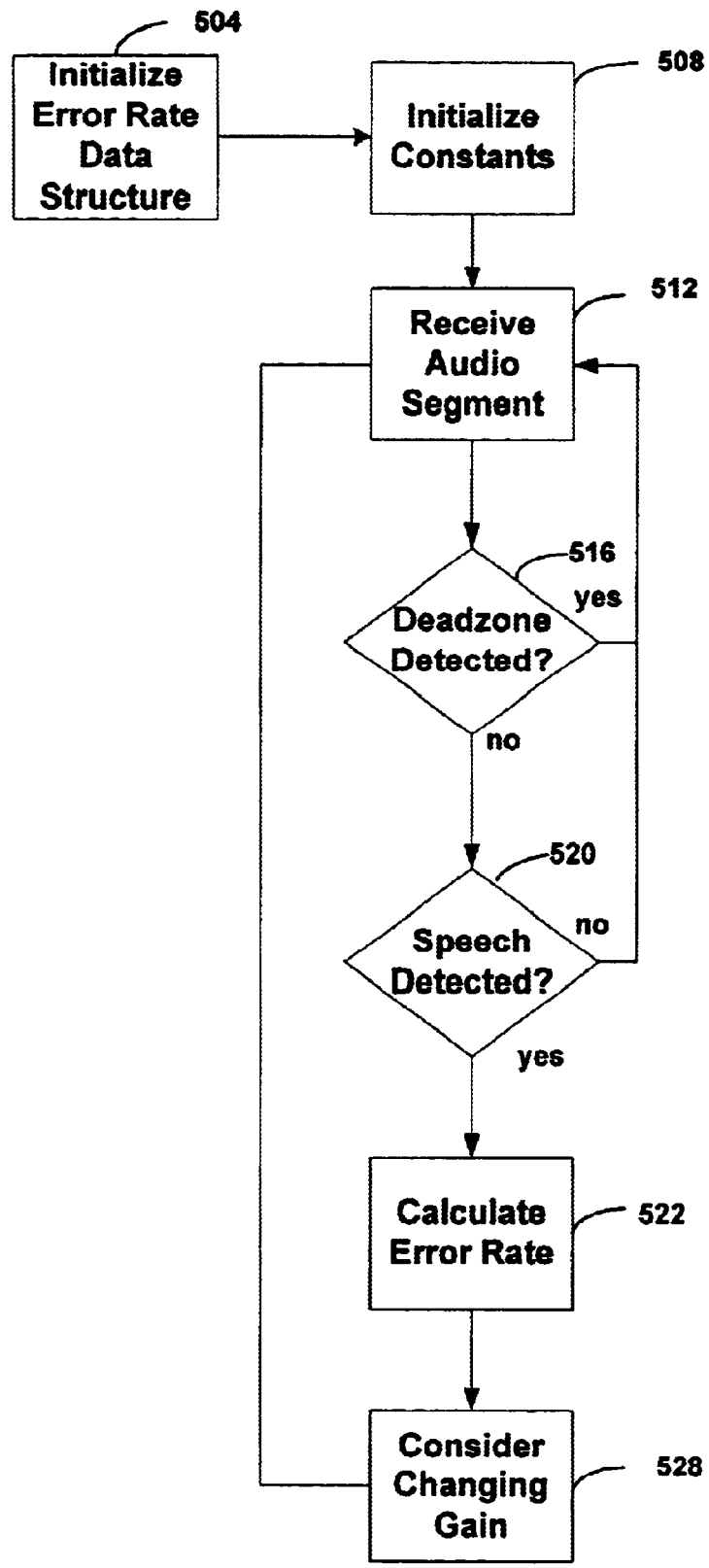
FIG. 5 is a flow diagram of an exemplary process for dynamic adjustment of gain level in accordance with the present invention.

Referring now to FIG. 5, in combination with FIG. 4, at step 504, all elements 410, 412, 414, 416, etc. of an array 400 or other suitable data structure in which is stored the historical clipping error rate for each possible gain level is set to equal the target clipping error rate for the application. In general, the target clipping rate will be one in which the incidence of clipping in the input data is very low but not zero.

At step 508, a constant representing the number of gain levels recognized is set. Gain is not viewed as a continuum but as a series of discrete values. By raising the value of the constant, an arbitrary degree of precision of the gain levels can be achieved. Array 400 has a number of cells approximately equal to the gain levels constant.

At step 508 the target clipping ratio is set. Target clipping ratio is the ratio of "clipping" samples over total samples that is considered to result in a good strong input signal.

At step 508, a constant representing the number of milliseconds of input "history" that will be tracked for each gain level is set. Making this value larger results in a slower change in gain as a result of changes in audio pickup conditions, so that the gain levels are changed less often. Making this value smaller results in a quicker reaction to changes in audio pickup conditions. The number of samples represented by this constant is also calculated. For example if 10 seconds of history is tracked, and the sampling rate (discussed below) is 11,025 samples per second, the number of samples tracked would be 110,250 samples (11,025 samples/second*10 seconds=110,250 samples.

Also at step 508, the starting gain level is set to an application-defined value appropriate for the application. The current gain level is initially an estimate of the gain level that is required to achieve the target clipping error rate. After the application is run for the first time, the ending gain level may be saved and used to initialize the starting gain level the next time the application is run.

Also at step 508, a constant representing a clipping threshold is set.

If the absolute value of a sample of audio is higher than this constant, a "clip" or clipping error has occurred. In one embodiment, a constant representing the amount a gain level must differ from the target clipping ratio before the gain may be lowered, is set. For example, a value of 1.05 would mean that the current gain level would be eligible for lowering if the clipping rate associated with that gain level is not within 5% of the target clipping rate. More specifically, assume that a target clipping rate of 0.100 is configured by the application and input to the process. Assume further that the constant representing the amount a gain level must differ from the target clipping ratio before the gain may be lowered, is set to 1.05. If the error rate for the current gain level is 0.110, the gain level would be lowered because 0.110 is more than 1.05 of 0.100. In contrast, if the error rate for the current gain level is 0.01, the gain level would not be lowered because 0.101 is not at least 1.05 of 0.100.

Some audio devices, if the gain is lowered too far, effectively become muted, i.e. the device will not provide suitable input regardless of audio input characteristics. To detect this condition, a deadzone threshold constant and a deadzone length of time constant for an audio sample is set. A value of audio sample that is below this threshold for a period of time exceeding the deadzone length of time constant, represents a gain level for the input device that is too low to provide suitable input. The deadzone length-of-time constant represents a length of time in milliseconds. Receiving a string of audio samples whose value is lower than the above-mentioned threshold constant for a length of time greater than the deadzone length-of-time constant means that the input gain has been lowered too far. The error rate for this gain level is set to a value that indicates that this gain level is not to be used again.

At step 512, an audio segment or packet is received. An audio segment or packet may contain a number of samples of data, typically 11,025 samples per seconds or 22,050 samples per second, but any sampling rate is contemplated by the invention. As discussed above, the higher the sampling rate, the more closely the output audio will reflect the input audio.

A variable tracks how long input data has been in the "deadzone". Initially this variable is set to zero. If no samples in a frame of data exceed the deadzone threshold constant, the length of the frame (typically in milliseconds) is added to the deadzone variable. If at least one sample in the frame exceeds the deadzone threshold, the deadzone variable is set to zero.

If the deadzone variable exceeds the deadzone length-of-time constant, the cell in data structure 400 representing the current gain level is set to zero so that this gain level will never be used again during the session and the gain is increased one level.

At step 520, an audio segment is examined to see if the segment contains speech. If speech is not detected, the gain level is not changed and the next audio segment is processed at step 512. An audio segment is analyzed for speech at step 520 by a voice activity algorithm as is well-known in the art. The use of any suitable voice activity algorithm is contemplated by the invention.

At step 522, the number of samples whose absolute value exceed a clipping threshold constant set in step 508 are counted. These samples are the clipped samples. The number of samples in the packet which do not contain clips is counted (the absolute value of these samples does not exceed the clipping threshold constant). The clipping error rate is then calculated in accordance with the following formula:

Clipping error rate for the current gain level=(number of samples with lips+(the clipping error rate for the current gain level stored in the array*the number of samples tracked in history))/ (number of samples with clips+number of samples without clips+number of samples tracked in history).

For example, if:
Current Gain Level=3
Number of samples with clips=1
Error rate for current gain level (3)=0.1
Number of samples tracked=10
Number of samples without clips=9
The new error rate for the current gain level 3 would be:

(1+(0.1*10))/1+9+10=0.1

At step 524, the new clipping error rate is compared to the target clipping error rate. If the clipping error rate for the current gain level is larger than the target clipping ratio, how far the error rate associated with the current gain level is from the target clipping error rate is calculated according to the formula:

Distance from target clipping error rate=clipping error rate of current gain level/target clipping ratio.

If the current distance from the target clipping error rate is less than 1.0, the current distance from the target clipping error rate is set to 1.0/current distance from the target clipping error rate.

The distance from target clipping error rate is then calculated for the clipping error rate associated with the next lower gain according to the following formula:

Distance from target clipping error rate=clipping error rate for next lowest gain level/target clipping ratio.

If the current distance from the target clipping error rate is less than 1.0, the current distance from the target clipping error rate is set to 1.0/current distance from the target clipping error rate.

If the lower gain level's error rate is closer to the target clipping error rate, and the distance between the clipping error rate and the target clipping error rate meets some minimum threshold, then the current gain level is lowered by one and the next audio segment is processed at step 512.

If the clipping error rate for the current gain level is less than or equal to the target clipping rate, the gain level is increased by one and processing proceeds to step 512.

In accordance with another embodiment of the invention, gain level will not be lowered if there was no clipping on the most recent packet.

In accordance with another aspect of the invention, the gain level will not be adjusted for two packets in a row.

The described invention is appropriate for a computing system that processes input data one packet at a time. Typically, a packet tends to be between 50 ms and 200 ms of audio data however, the present invention contemplates the processing of packets whose length does not fall within this time range. The present invention also is appropriate for situations where data is processed one audio sample at a time, as might exist, for example in an embedded system. An embedded system is a computing device which performs a limited set of functions, such as (but not limited to) a digital phone or set top box.

Exemplary Computing Environment

Figure 6:
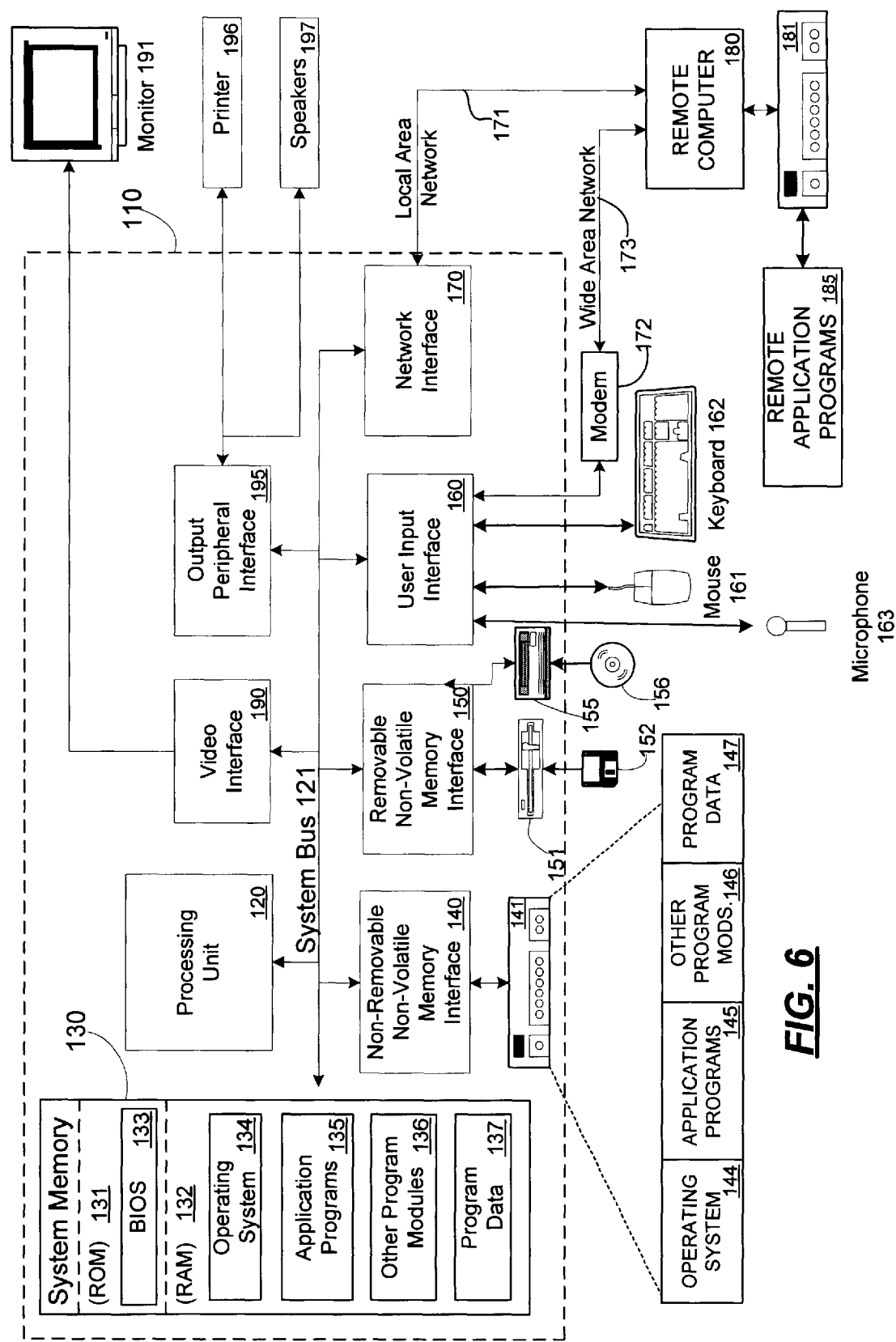
FIG. 6 is a block diagram of an exemplary computing environment in which aspects of the invention may be implemented.

FIG. 6 illustrates an example of a suitable computing system environment 100 in which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices.

With reference to FIG. 6, an exemplary system for implementing the invention includes a general purpose computing device in the form of a computer 110. Components of computer 10 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 10 typically includes a variety of computer readable media. Computer readable media can be any available media that can be accessed by computer 10 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can accessed by computer 10. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 6 illustrates operating system 134, application programs 135, other program modules 136, and program data 137.

Computer 110 may also include other removable/non-removable, volatile/nonvolatile computer storage media. By way of example only, FIG. 6 illustrates a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 6, provide storage of computer readable instructions, data structures, program modules and other data for the computer 110. In FIG. 6, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices may include a microphone 163, joystick, game pad, satellite dish, scanner, or the like (not shown). These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 6. The logical connections depicted in FIG. 6 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 6 illustrates remote application programs 185 as residing on memory device 181. It will be appreciated that the network connections shown are exemplary and other means of establishing a communications link between the computers may be used.

What is claimed is:

1. A method of capturing an audio input signal comprising:
   providing a target audio input signal error rate for an application;
   tracking an actual audio signal error rate associated with a particular gain level;
   comparing said actual audio signal error rate for said gain level to said target audio input error rate for said application; and
   adjusting said gain level to approach said target error rate for said application.

2. The method of claim 1, wherein said error rate further comprises a rate of clipping errors.

3. The method of claim 1, wherein said gain level is dynamically modified as a function of said target error rate.

4. The method of claim 1, wherein said adjusting said gain level further comprises adjusting said gain level to compensate for capture errors caused by said gain level being too high.

5. The method of claim 1, wherein said adjusting said gain level further comprises adjusting said gain level to compensate for capture errors caused by said gain level being too low.

6. The method of claim 1, wherein adjusting said gain level further comprises:
   receiving a target error rate for recording said audio input signal;
   computing a first error rate for a first gain level;
   computing a second error rate for a second gain level;
   comparing said first error rate associated with said first gain level with said target error rate; and
   comparing said second error rate associated with said second gain level with said target error rate.

7. The method of claim 6 further comprising setting said gain level to said gain level associated with said second error rate if said second error rate is numerically closer to said target error rate than is said first error rate associated with said first gain level.

8. The method of claim 6, wherein said gain level varies from said second gain level by a fixed increment.

9. The method of claim 8, wherein said fixed increment is one gain level.

10. The method of claim 6, further comprising:
    receiving a first gain level and associated first error rate;
    receiving a second gain level and associated second error rate;
    receiving a third gain level and associated third error rate;
    setting said gain level to said gain level associated with said second error rate; and
    not setting said gain level to said gain level associated with said third error rate.

11. The method of claim 6, further comprising setting said gain level to said gain level associated with said second error rate if said first error rate deviates from said target error rate by at least a specified amount.

12. The method of claim 1, further comprising adjusting said gain level upwards one level if said absolute value of said audio input signal falls below a specified constant for at least a specified period of time.

13. The method of claim 12, further comprising setting said error rate to a value that signifies that said gain level should never be used.

14. A system for capturing an audio input signal, said system comprising:
    a receiver for receiving an audio input signal;
    a memory for storing said signals; and
    a computing device for dynamically determining a gain level to achieve a target error rate as a function of an historical error rate associated with said gain level.

15. The system of claim 14, wherein said audio input signal is transmitted over a network.

16. The system of claim 14, further comprising a device for automatically adjusting said gain level to achieve said target error rate.

17. The system of claim 14, wherein said error rate comprises a clipping error rate.

18. A computer-readable medium containing computer-executable instructions for recording an audio input signal, comprising computer-readable instructions for:
    providing a target audio input signal error rate for an application;
    tracking an actual audio signal error rate associated with a particular gain level;
    comparing said actual audio signal error rate for said gain level to said target audio input error rate for said application; and
    adjusting said gain level to approach said target error rate for said application.

* * * * *

UNITED STATES PATENT AND TRADEMARK OFFICE
CERTIFICATE OF CORRECTION

PATENT NO. : 6,704,704 B1
DATED : March 9, 2004
INVENTOR(S) : Newson et al.

It is certified that error appears in the above-identified patent and that said Letters Patent is hereby corrected as shown below:

Column 1,
Line 49, after "may", delete "Ad".

Column 6,
Lines 30-31, there should be no paragraph after "threshold is set".

Column 7,
Line 33, delete "lip" and insert therefor -- clips --.

Column 9,
Line 30, delete "10" and insert therefor -- 110 --.

Signed and Sealed this

Third Day of August, 2004

JON W. DUDAS
*Acting Director of the United States Patent and Trademark Office*